United States Patent
Gu et al.

(10) Patent No.: US 10,028,333 B2
(45) Date of Patent: Jul. 17, 2018

(54) RADIAL FIN HEAT SINK FOR REMOTE RADIO HEADS AND THE LIKE

(71) Applicant: CommScope Technologies LLC, Hickory, NC (US)

(72) Inventors: Qiyun Gu, Shanghai (CN); YongJie Xu, Shanghai (CN); Sammit Patel, Richardson, TX (US)

(73) Assignee: CommScope Techologies LLC, Hickory, NC (US)

( * ) Notice: Subject to any disclaimer, the term of this patent is extended or adjusted under 35 U.S.C. 154(b) by 12 days.

(21) Appl. No.: 14/829,028

(22) Filed: Aug. 18, 2015

(65) Prior Publication Data
US 2016/0066476 A1 Mar. 3, 2016

Related U.S. Application Data

(60) Provisional application No. 62/045,097, filed on Sep. 3, 2014.

(51) Int. Cl.
| | |
|---|---|
| *H05K 7/20* | (2006.01) |
| *H04W 88/08* | (2009.01) |
| *H01L 23/367* | (2006.01) |
| *F28F 3/02* | (2006.01) |

(52) U.S. Cl.
CPC .............. *H04W 88/08* (2013.01); *F28F 3/02* (2013.01); *H01L 23/3675* (2013.01); *H05K 7/20127* (2013.01); *H05K 7/20409* (2013.01)

(58) Field of Classification Search
CPC ............. H01L 23/3672; H01L 23/4093; F21V 29/2212; F21V 29/75; F21V 29/74; H04W 88/08; F28F 3/02; H05K 7/20409
See application file for complete search history.

(56) References Cited

U.S. PATENT DOCUMENTS

| | | | | |
|---|---|---|---|---|
| 2,936,409 | A * | 5/1960 | Power | H01L 23/467 165/122 |
| 5,927,386 | A * | 7/1999 | Lin | G11B 33/1426 165/121 |
| 6,308,771 | B1 * | 10/2001 | Tavassoli | F28F 3/02 165/80.3 |

(Continued)

OTHER PUBLICATIONS

"Extruded Heat Sinks for Power Semiconductors", retrieved from http://www.wakefield-vette.com/resource-center/downloads/brochures/extruded-heat-sink-wakefield.pdf on Jul. 30, 2015 (9 pages).

*Primary Examiner* — Robert J Hoffberg
*Assistant Examiner* — Hung Dang
(74) *Attorney, Agent, or Firm* — Myers Bigel, P.A.

(57) ABSTRACT

In one embodiment, an apparatus includes three remote radio heads (RRHs) mounted on a pole using one or more triangular brackets, each RRH connected to a corresponding antenna. Each RRH includes an electronics module, a heat sink mounted on the electronics module, and a cover attached to the heat sink. The heat sink comprises a base, a plurality of attached forward-facing fins, and a pair of backward-facing fins. Each forward-facing fin and backward-facing fin comprises a proximal end attached to the base and an opposite distal end. The proximal ends of the plurality of forward-facing fins are collinear. The distal ends of the plurality of forward-facing fins and the backward-facing fins define an arc of an ellipse.

10 Claims, 4 Drawing Sheets

(56) References Cited

U.S. PATENT DOCUMENTS

| | | | | |
|---|---|---|---|---|
| 6,466,444 B2* | 10/2002 | Cheung | F28F 3/02 | 165/185 |
| 7,274,571 B2* | 9/2007 | Wei | H05K 7/20727 | 165/104.26 |
| 7,443,678 B2* | 10/2008 | Han | F21K 9/00 | 165/104.33 |
| 7,488,093 B1* | 2/2009 | Huang | F21S 8/086 | 362/294 |
| 7,815,338 B2* | 10/2010 | Siemiet | F21V 3/02 | 362/218 |
| 8,408,742 B2* | 4/2013 | Tran | F21V 19/0045 | 362/171 |
| 2002/0195229 A1* | 12/2002 | Hsieh | F28F 3/04 | 165/80.3 |
| 2008/0239632 A1* | 10/2008 | Wayman | H05K 5/0204 | 361/600 |
| 2009/0219713 A1* | 9/2009 | Siemiet | F21V 3/02 | 362/218 |
| 2010/0208460 A1* | 8/2010 | Ladewig | F21S 8/086 | 362/235 |
| 2011/0305024 A1* | 12/2011 | Chang | F21V 5/02 | 362/294 |
| 2014/0140074 A1* | 5/2014 | Chen | F21V 3/0436 | 362/373 |
| 2016/0105080 A1* | 4/2016 | Bradfield | H02K 5/18 | 310/54 |

* cited by examiner

RADIAL FIN HEAT SINK FOR REMOTE RADIO HEADS AND THE LIKE

This application claims the benefit of the filing date of U.S. Provisional Application No. 62/045,097 filed on Sep. 3, 2014, the teachings of which are incorporated herein by reference in their entirety.

BACKGROUND

The current disclosure relates to wireless transceivers and particularly, but not exclusively, to heat sinks for radio-frequency (RF) transceivers in cellular networks.

A remote radio head (RRH) is a radio-frequency transceiver used in cellular networks to extend the network's reach. An RRH is typically mounted on a structure, tower, or pole proximate to a corresponding, similarly mounted antenna. The RRH is communicatively connected to (i) a cellular-network base band unit (BBU)—via, e.g., fiber-optic cables—and (ii) the corresponding antenna—via, e.g., coaxial cables. The placement of the RRH close to the antenna reduces power lost through signal transmission over coaxial cables—particularly in comparison with legacy systems that do not use an RRH and have the antenna connected to remotely located radios via coaxial cables.

The RRH comprises active electronic circuits such as power amplifiers for amplifying transmit and receive signals. The power amplifiers in the RRH generate significant amounts of heat which needs to be dissipated to prevent damage to the power amplifiers and/or other components of the RRH.

FIG. 1A is a simplified perspective view of a conventional RRH sub-assembly 100. FIG. 1B is a cross-sectional view in the x-y plane of the heat sink 101 of the RRH sub-assembly 100 of FIG. 1A. RRH sub-assembly 100 comprises a transceiver electronics module 102 and a heat sink 101. Electronics module 102 comprises a substantially box-like exterior that houses active circuitry (not shown) including heat-generating components such as power amplifiers. Electronics module 102 may also include one or more input/output ports (not shown) for connecting the RRH sub-assembly 100 to a BBU and/or an antenna.

Heat sink 101 is mated to electronics module 102 and helps dissipate heat from the electronics module 102. Heat sink 101 is made of a metal such as, for example, copper or aluminum. Heat sink 101 comprises a box-like base 103 and a plurality of substantially identical parallel fins 104 projecting perpendicularly away from the base 103.

SUMMARY

One embodiment of the disclosure can be an apparatus comprising a heat sink for an electronics module. The heat sink comprises a base and a plurality of forward-facing fins. A first side of the base is adapted for mounting to the electronics module. Each forward-facing fin comprises (i) a proximal end attached to a second side of the base and (ii) an opposite distal end. The proximal ends of the plurality of forward-facing fins are collinear. The distal ends of the plurality of forward-facing fins define an arc of an ellipse.

BRIEF DESCRIPTION OF THE DRAWINGS

Other embodiments of the invention will become apparent. In the accompanying drawings, like reference numerals identify similar or identical elements.

DETAILED DESCRIPTION

Although conventional heat sinks provide generally adequate heat dissipation to conventional remote radio heads (RRHs), using novel heat sinks for dissipating heat from the electronics module of an RRH may provide useful benefits relative to the conventional heat sinks. For example, an RRH using a below-described novel heat sink may dissipate heat more efficiently and may be more aesthetically pleasing than an RRH using a conventional heat sink.

Figure 2B:
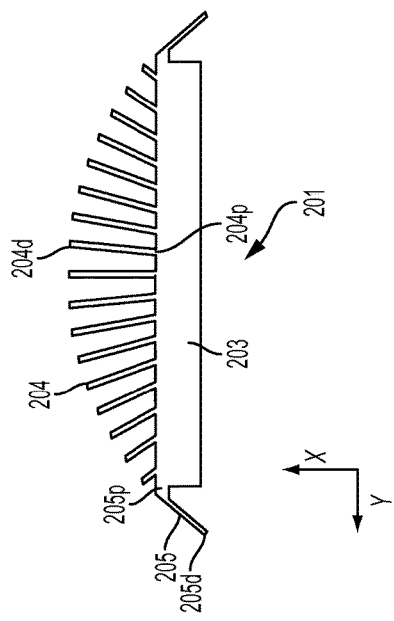
FIG. 2B is a cross-sectional view in the x-y plane of the heat sink of the RRH sub-assembly of FIG. 2A.
Figure 2C:
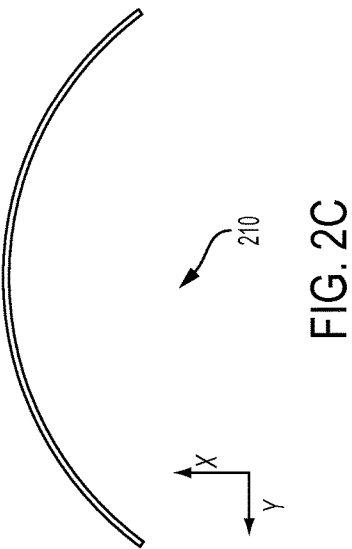
FIG. 2C is a cross-sectional view in the x-y plane of the cover of the RRH sub-assembly of FIG. 2A.
Figure 2A:
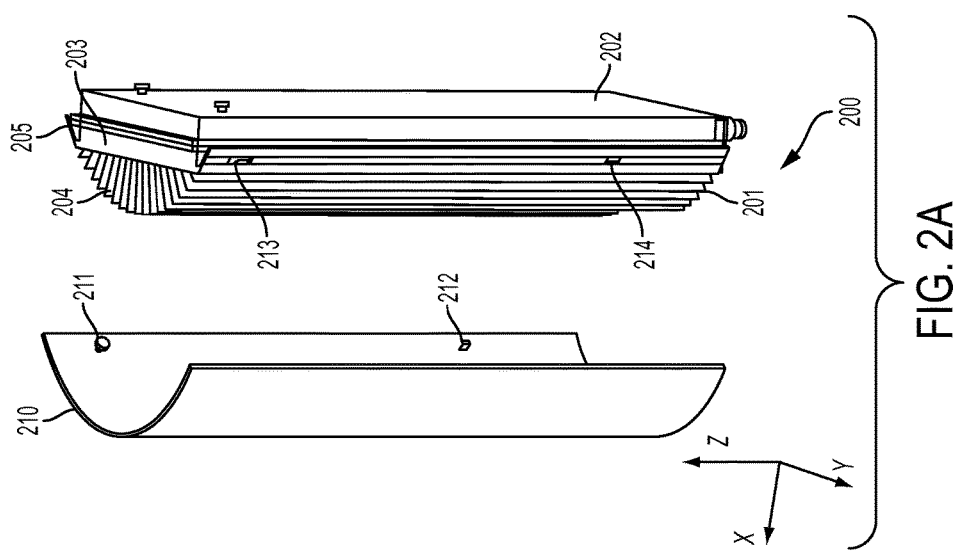
FIG. 2A is an exploded perspective view of an RRH sub-assembly in accordance with one embodiment of the present disclosure.

FIG. 2A is an exploded perspective view of an RRH sub-assembly 200 in accordance with one embodiment of the present disclosure. FIG. 2B is a cross-sectional view in the x-y plane of the heat sink 201 of the RRH sub-assembly 200 of FIG. 2A. FIG. 2C is a cross-sectional view in the x-y plane of the cover 210 of RRH sub-assembly 200 of FIG. 2A. Note that the coordinate axes have been included to assist in the description and are not part of the embodiment. RRH sub-assembly 200 comprises an electronics module 202, heat sink 201, and cover 210. The electronics module 202 is a substantially box-like container housing active circuitry (not shown) that includes heat-generating components such as, for example, power amplifiers.

The cover 210 is substantially a curved rectangular plate, which may also correspond to an arcuate section of an elliptical—e.g., circular—pipe of the same height (along the z-axis) as the cover 210. The cover 210 includes one or more hooks 211 and bayonets 212 for attachment to the heat sink 201. The cover 210 acts as a shield for the heat sink 201 and can provide an aesthetic enhancement to the RRH sub-assembly 200.

Heat sink 201 comprises a thermally conductive material such as, for example, copper or aluminum. The heat sink 201 comprises a base 203, a plurality of forward-facing fins 204, and a pair of backward-facing fins 205. The base 203 is mounted and thermo-conductively connected to the electronics module 202 to dissipate heat from the electronics module 202 to the surrounding environment via the fins 204 and 205. Each forward-facing fin 204 has (i) a proximal end 204p where the fin 204 attaches to the base 203 and (ii) an opposite distal end 204d. Similarly, each backward-facing fin 205 has (i) a proximal end 205p where the fin 205 attaches to a side of the base 203 and (ii) a distal end 205d.

The forward-facing fins 204 are radially and truncatedly disposed in the x-y plane. In particular, the further a fin 204 is located from the center of heat sink 201 along the y-axis, (i) the greater its angle from the x-axis and (ii) the shorter it is. Thus, for example, (i) the central fin 204 is at zero degrees from the x-axis and is the longest fin 204 and (ii) the left-most and right-most fins 204 are at approximately 45 degrees from the x-axis and are the shortest fins 204. Note that, if the lines of the fins 204 in the x-y plane, as seen in FIG. 2B, were to be extended, they may all intersect at an origin point equidistant from the distal ends 204d. It should be noted that, since the fins 204 have a height along the z-axis, the intersection of extensions of the fins 204 in three dimensions would form an origin line on the other side of the base 203. The forward-facing fins 204 are shaped and disposed such that the proximal ends 204p are substantially collinear while the distal ends 204d define an arc. The arcuate cross-section in the x-y plane of the cover 210 is such so as to fit over the arc formed by the distal ends 204d. The arcs formed by the cover 210 and the distal ends 204d may be substantially similar to arcs of an ellipse, such as a circle.

The backward-facing fins 205 substantially continue the arc defined by the distal ends 204d backwards along the x-axis. In other words, proximal ends 205p and distal ends 205d may be considered to be located along extensions of the arc defined by the distal ends 204d. Note that proximal ends 205p may also be collinear with the proximal ends 204p. The shapes of the backward-facing fins 205 are curved so as to snugly fit underneath the corresponding segments of the cover 210. The measure of the arc of the cover 210 as well as the arc defined by the distal ends 204d and 205d may be between 90 and 120 degrees.

Heat sink 201 also includes one or more (i) apertures 213 for corresponding hooks 211 of the cover 210 and (ii) apertures 214 for corresponding bayonets 212 of the cover 210. A hook 211 of the cover 210 is inserted into and hangs off of the corresponding aperture 213. A bayonet 212 is inserted into the corresponding aperture 214. Typically, cover 210 is removably attached to the heat sink 201 by first hooking hooks 211 into corresponding apertures 213 and then inserting bayonets 212 into corresponding apertures 214.

Figure 1A:
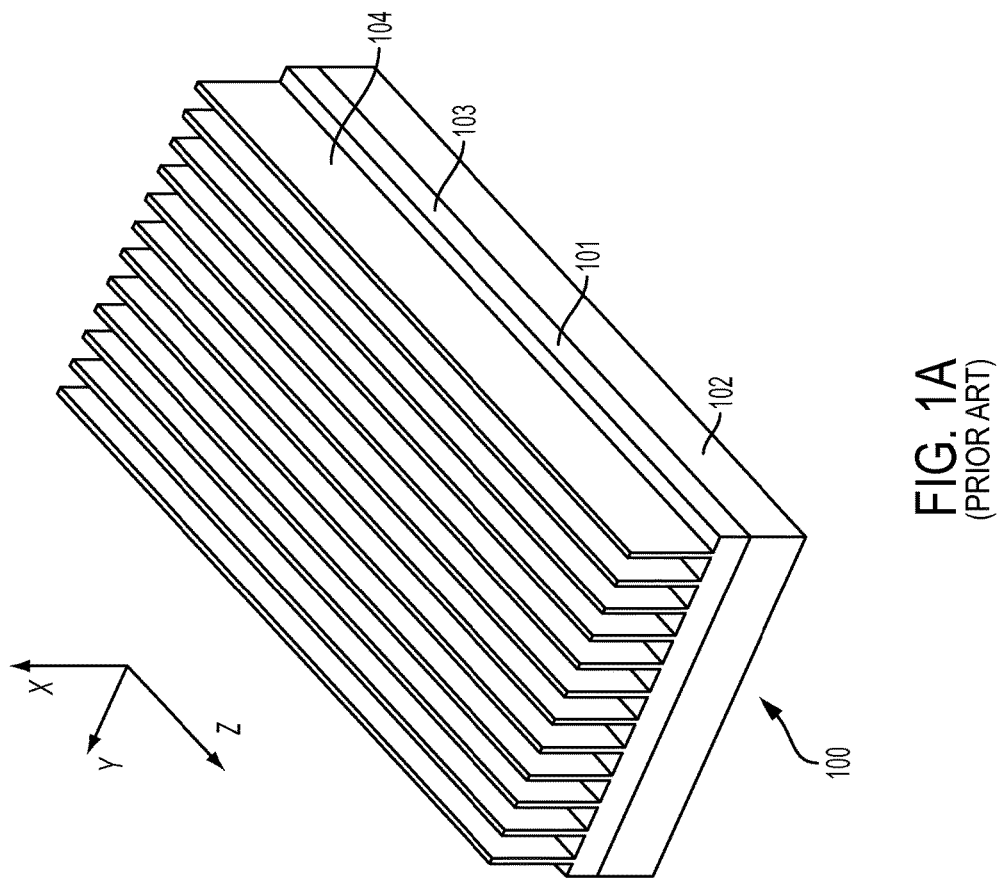
FIG. 1A is a simplified perspective view of a conventional RRH sub-assembly.
Figure 1B:
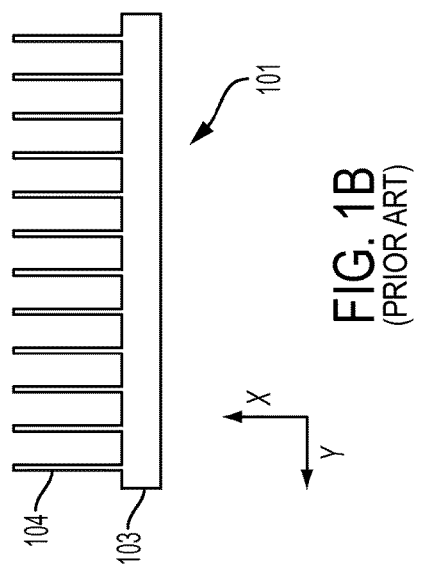
FIG. 1B is a cross-sectional view in the x-y plane of the heat sink of the RRH sub-assembly of FIG. 1A.
Figure 3A:
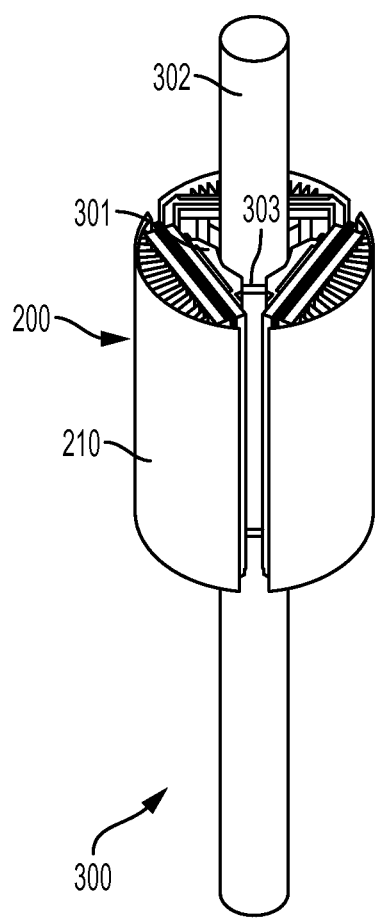
FIG. 3A is a simplified perspective view of an RRH assembly in accordance with an embodiment of the disclosure.
Figure 3B:
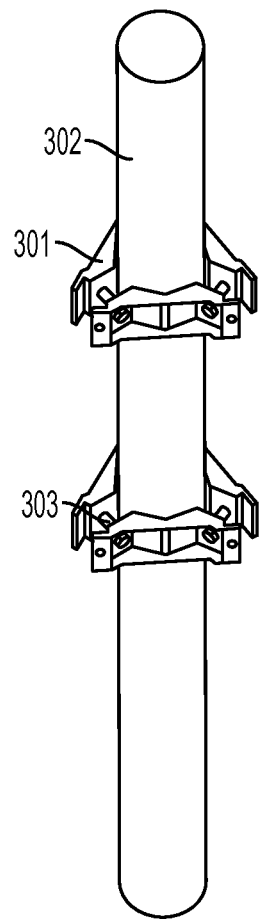
FIG. 3B is a simplified perspective view of the mounting brackets, mounting screws, and pole of the RRH assembly of FIG. 3A.

FIG. 3A is a simplified perspective view of an RRH assembly 300 in accordance with an embodiment of the disclosure. FIG. 3B is a simplified perspective view of the mounting brackets, bracket-mounting screws, and pole of the RRH assembly 300 of FIG. 3A. RRH assembly 300 comprises a pole 302, two triangular mounting brackets 301, three RRH sub-assemblies 200, and several bracket-mounting screws 303. The three-part triangular mounting brackets 301 are secured to the pole 302 using bracket-mounting screws 303. Three RRH sub-assemblies 200 of FIG. 2A are mounted to the pair of triangular brackets 301. The covers 210 of the three RRH sub-assemblies 200 form an open segmented circular cylinder, where each cover 210 corresponds to a segment. The segmented cylinder exterior may be viewed as more aesthetically pleasing than the irregular open shape that would be formed by mounting three RRH sub-assemblies 100 of FIG. 1A on similar triangular mounting brackets. Furthermore, the above-described origin points (not shown) for the three RRH sub-assemblies 200 would coincide at the central axis of the pole 302. The arc measure of a cylinder gap between the covers 210 of adjacent RRH sub-assemblies 200 is substantially the difference between 120 degrees (in other words, a third of a circle) and the arc measure of the cover 210. Thus, depending on the implementation, the segments of the open segmented cylinder formed by the covers 210 may touch or may be separated by gaps.

Figure 4:
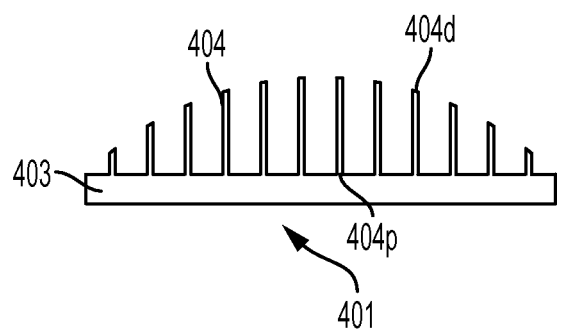
FIG. 4 is a cross-sectional view of a heat sink in accordance with an alternative embodiment of the disclosure.

FIG. 4 is a cross-sectional view of a heat sink 401 in accordance with an alternative embodiment of the disclosure. The heat sink 401 comprises a base 403 and a plurality of forward-facing fins 404, each having a proximal end 404p and a distal end 404d. The proximal ends 404p are collinear while the distal ends 404d define an arc of an ellipse. The fins 404 are parallel to each other and perpendicular to the surface of the base 403 to which they are attached. A trio of heat sinks 401 may be used in conjunction with a trio of electronics modules, such as electronics module 202 of FIG. 2A, and mounted on triangular brackets 301 of FIG. 3B to form an open-cylinder-shaped apparatus similar to assembly 300 of FIG. 3A. This alternative assembly may optionally include covers and/or backward-facing fins.

An embodiment of the disclosure has been described where the RRH sub-assembly comprises a cover. It should be noted, however, that the cover is an optional component of the RRH sub-assembly. In alternative embodiments, the RRH sub-assembly does not include a cover. In these embodiments, (i) the heat sink may nevertheless have apertures for hooks and/or bayonets of an optional cover or (ii) the heat sink may be devoid of such apertures.

An embodiment of the disclosure has been described where a heat sink with radial fins comprises backward-facing fins. It should be noted, however, that the backward-facing fins are optional. Some alternative embodiments do not include backward-facing fins.

Embodiments of the invention have been described where the distal ends of the fins are shown as having a flat trim. The invention is not, however, so limited. In alternative implementations, the distal ends may instead be beveled, rounded, thickened, or otherwise shaped.

An embodiment of the invention has been described where the backward-facing fins are curved so as to fit snugly under the cover and where the proximal and distal ends of the backward-facing fins are along the arc defined by the distal ends of the forward-facing fins. The invention is not, however, so limited. In alternative embodiments, the backward-facing fins may be otherwise curved, may be straight, and/or may be shaped so as to provide a substantial air gap between the fins and the cover.

An embodiment of the disclosure has been described where the cover of an RRH sub-assembly comprises a particular arrangement of hooks and bayonets for attaching the cover to the heat sink of the RRH sub-assembly. The invention is not, however, so limited. Alternative embodiments may have different arrangements of hooks and bayonets, as well as corresponding apertures on the heat sink. Some alternative embodiments may use only hooks or only bayonets. Some alternative embodiments may use fasteners other than hooks and bayonets. Some alternative embodiments may have hooks and/or bayonets located on the heat sink with the corresponding apertures on the cover.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

We claim:

1. An apparatus comprising a heat sink for an electronics module, wherein:
   the heat sink comprises a base, a plurality of forward-facing fins, and a plurality of backward-facing fins;
   a first side of the base is substantially planar and adapted for mounting to the electronics module;
   each forward-facing fin comprises (i) a proximal end attached to a second side of the base and (ii) an opposite distal end;
   each backward-facing fin comprises (i) a proximal end attached to the second side of base and (ii) an opposite distal end;
   the proximal ends of the plurality of forward-facing fins are collinear; and
   the distal ends of the plurality of forward-facing fins define an arc of an ellipse;
   the distal ends of the plurality of backward-facing fins define extensions of the arc of the ellipse defined by the plurality of forward-facing fins;
   wherein the second side of the base is substantially planar and parallel to the first side;
   wherein each of the forward-facing fins is not parallel with at least one immediately adjacent forward-facing fin;
   wherein a first forward-facing fin of the plurality of forward-facing fins is located farther from a center line of the first side of the base than a second forward-facing fin of the plurality of forward-facing fins,
   wherein the first forward-facing fin has a greater angle measurement between the first forward-facing fin and a line perpendicular to the first side of the base than the second forward-facing fin and the line perpendicular to the first side of the base; and
   wherein the first forward-facing fin of the plurality of forward-facing fins has a shorter length, measured from the proximal end of the first forward-facing fin to the distal end of the first forward-facing fin, than a length of the second forward-facing fin, measured from the proximal end of the second forward-facing fin to the distal end of the second forward-facing fin.

2. The apparatus of claim 1, wherein the ellipse is a circle.

3. The apparatus of claim 2, wherein a measure of the arc is between 90 and 120 degrees.

4. An apparatus comprising a heat sink for an electronics module, wherein:
   the heat sink comprises a base and a plurality of forward-facing fins and a plurality of backward-facing fins;
   a first side of the base is substantially planar and adapted for mounting to the electronics module;
   each forward-facing fin comprises (i) a proximal end attached to a substantially planar second side of the base and (ii) an opposite distal end;
   each backward-facing fin comprises (i) a proximal end attached to the second side of base and (ii) an opposite distal end;
   the proximal ends of the plurality of forward-facing fins are collinear,
   the distal ends of the plurality of forward-facing fins define an arc of an ellipse; and
   the first side of the base and the second side of the base are parallel;
   the apparatus further comprising a cover, wherein:
   the cover comprises a plate having a curvature and adapted to fit over the heat sink, the cover further comprising at least one of a plurality of hooks and/or a plurality of a plurality of bayonets;
   the curvature of the cover corresponds to the arc defined by the distal ends of the plurality of forward-facing fins;
   the backward-facing fins comprise a plurality of apertures corresponding to the plurality of hooks and/or the plurality of bayonets and adapted to receive the plurality of hooks and/or the plurality of bayonets; and
   the cover is removably attached over the heat sink.

5. The apparatus of claim 4, wherein the cover comprises both hooks and bayonets.

6. The apparatus of claim 1, wherein:
   the apparatus comprises the electronics module;
   the first side of the heat sink is mounted to the electronics module;
   the apparatus further comprises a cover;
   the cover comprises a plate having a curvature and adapted to fit over the heat sink;
   the curvature of the cover corresponds to the arc defined by the distal ends of the plurality of forward-facing fins;
   the cover is removably attached over the heat sink; and
   the ellipse is a circle.

7. The apparatus of claim 6, wherein:
   the electronics module, heat sink, and cover form a remote radio head (RRH) sub-assembly; and
   the apparatus further comprises a bracket adapted to mount the RRH sub-assembly to a pole.

8. The apparatus of claim 7, wherein the bracket is further adapted to mount two additional instances of the RRH sub-assembly to the pole, such that the three covers form an open segmented circular cylinder.

9. A remote radio head subassembly, comprising:
an electronics module comprising one or more input/output ports for connecting the remote radio head subassembly to a base band unit and/or an antenna;
a heat sink comprising a base, a plurality of forward-facing fins, and a plurality of backward-facing fins;
a first substantially planar-side of the base mounted to the electronics module; each forward-facing fin comprising (i) a proximal end attached to a second substantially planar side of the base and (ii) an opposite distal end;
each backward-facing fin comprising (i) a proximal end attached to the second side of base and (ii) an opposite distal end;
the proximal ends of the plurality of forward-facing fins being collinear;
each of the forward-facing fins is not parallel with at least one immediately adjacent forward-facing fin;
the distal ends of the plurality of forward-facing fins defining an arc of an ellipse; and
the distal ends of the plurality of backward-facing fins defining extensions of the arc of the ellipse.

10. A plurality of remote radio head subassemblies as defined in claim 9 mounted to a pole to form a cylindrical remote radio head.

* * * * *

UNITED STATES PATENT AND TRADEMARK OFFICE
CERTIFICATE OF CORRECTION

PATENT NO. : 10,028,333 B2
APPLICATION NO. : 14/829028
DATED : July 17, 2018
INVENTOR(S) : Gu et al.

Page 1 of 1

It is certified that error appears in the above-identified patent and that said Letters Patent is hereby corrected as shown below:

In the Claims

Column 6, Claim 4, Line 36: Please correct "are" to read -- arc --

Signed and Sealed this
Second Day of October, 2018

Andrei Iancu
*Director of the United States Patent and Trademark Office*